US006658361B1

United States Patent
Rehani et al.

(10) Patent No.: US 6,658,361 B1
(45) Date of Patent: Dec. 2, 2003

(54) HEAVIEST ONLY FAIL POTENTIAL

(75) Inventors: Manu Rehani, Portland, OR (US); Ramkumar Vaidyanathan, Gresham, OR (US); David A. Abercrombie, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 227 days.

(21) Appl. No.: 09/974,008

(22) Filed: Oct. 10, 2001

(51) Int. Cl.[7] .......................... G06F 19/00; H01L 21/66
(52) U.S. Cl. .......................... 702/81; 438/14; 700/121; 324/765
(58) Field of Search ............................... 702/81, 82, 83, 702/84, 117; 700/121; 438/14, 17; 324/537, 765

(56) References Cited

U.S. PATENT DOCUMENTS

| | | | | |
|---|---|---|---|---|
| 5,608,453 | A | * | 3/1997 | Gerber et al. .................. 348/87 |
| 6,265,232 | B1 | * | 7/2001 | Simmons ...................... 438/14 |
| 6,324,481 | B1 | * | 11/2001 | Atchison et al. ............... 702/84 |
| 6,338,001 | B1 | * | 1/2002 | Steffan et al. ................ 700/121 |
| 6,456,951 | B1 | * | 9/2002 | Maeda et al. ................. 702/84 |
| 6,487,511 | B1 | * | 11/2002 | Wooten ........................ 702/84 |
| 6,496,788 | B1 | * | 12/2002 | Kikuchi ....................... 702/181 |
| 2001/0023083 | A1 | * | 9/2001 | Simmons ...................... 438/14 |
| 2001/0051836 | A1 | * | 12/2001 | Lamey et al. ................. 700/110 |
| 2002/0032888 | A1 | * | 3/2002 | Ott et al. ...................... 714/724 |
| 2002/0142522 | A1 | * | 10/2002 | Pnueli et al. ................. 438/140 |
| 2002/0145112 | A1 | * | 10/2002 | Davidson ..................... 250/307 |
| 2003/0017664 | A1 | * | 1/2003 | Pnueli et al. ................ 438/200 |
| 2003/0120445 | A1 | * | 6/2003 | Barbour et al. ............... 702/81 |

OTHER PUBLICATIONS

Merino et al. "SmartBit: Bitmap to defect correlation software for yield improvement", IEEE, 2000.*

(List continued on next page.)

*Primary Examiner*—Patrick Assouad
(74) *Attorney, Agent, or Firm*—Luedeka Neely & Graham, P.C.

(57) ABSTRACT

A method for determining an effective fatal defect count based on defects in a plurality of inspected integrated circuits includes acquiring defect information related to defects in the integrated circuits, and assigning defect weight values to each of the defects based on the defect information. The defect weight values are in N number of defect weight value ranges, including a lowest and a highest defect weight value range. For each integrated circuit, a heaviest defect is determined, where the heaviest defect is the defect on each integrated circuit having a highest defect weight value. For each of the N number of defect weight value ranges, a total number $T(n)$ of the heaviest defects having a defect weight value within a defect weight value range n is determined, where n equals one to N. A weighted total defect count $T_W(n)$ is determined by weighting the total number $T(n)$ for each of the defect weight value ranges according to a weighting function $FP(n)$ which approaches zero at the lowest defect weight value range and approaches one at the highest defect weight value range. The effective fatal defect count is determined by summing the values of $T_W(n)$ for the N number of defect weight value ranges. The defect weight values are preferably assigned to each of the defects based on defect size, where the smallest defects are in the lowest defect weight value range, and the largest defects are in the highest defect weight value range. Since the heaviest only weighting gives more weight to large defects, the effective fatal defect count is weighted more heavily toward larger defects.

20 Claims, 4 Drawing Sheets

OTHER PUBLICATIONS

Nurani, "Effective Defect Management Strategies for Emerging Fab Needs", IEEE, 2001.*

Bichebois et al., "Analysis of Defect to Yield Correlation on Memories: Method, Algorithms and Limits", IEEE, 1997.*

Yoshitake et al., "Defect Control Using an Automatic Killer Defect Selection Method", IEEE, 1998.*

Ross, R. & Atchison, N., TI Technical Journal "The Calculation of Wafer Probe Yield Limits from In–Line Defect Monitor Data", Oct., 1998.

Kasten A. Zalnoski, J., and Mullenix, P., Semiconductor International "Calculating Defect Limited Yields From In–Line Inspections", Jul., 1997.

* cited by examiner

HEAVIEST ONLY FAIL POTENTIAL

FIELD

This invention relates to the field of yield prediction in a manufacturing environment. More particularly the invention relates to identifying a fail potential of a type of defect or of a part with defects.

BACKGROUND

During each step in an integrated circuit manufacturing process, defects may be introduced to the integrated circuit. For the specific example of the semiconductor industry, defects tend to be continuously introduced to the integrated circuits on a silicon wafer as it is processed. Some defects as are so insignificant that they alone do not cause operational failure of an integrated circuit, although a large number of singularly insignificant defects may in combination cause the failure of the integrated circuit. Some defects, however, are large enough to be the sole cause of the failure of the integrated circuit.

Currently, there are two widely implemented approaches to estimating the fail potential of an integrated circuit. In one approach, every identifiable defect in an integrated circuit, whether the defect be large or small, at each step in the manufacturing process is factored into the estimation of fail potential. In another approach, only those integrated circuits having a single defect are considered in estimating the fail potential. Both of these approaches have disadvantages. In the first, a significant amount of data is generated, but the results tend to be inaccurate and misleading because of the consideration of so many small defects that contribute little to the final result. In the second approach, there are typically so very few integrated circuits having only a single defect, that there tends to be a scarcity of data to use in calculating the fail potential. This causes low confidence in the results.

Thus, there are problems inherent with the known approaches to gauging integrated circuit quality as described above. What is needed, therefore, is a system for determining the fault potential of a type of defect with a high level of confidence and using minimal empirical data.

SUMMARY

The above and other needs are met by a method for determining an effective fatal defect count based on defects in a plurality of inspected integrated circuits. The method includes acquiring defect information related to defects in the inspected integrated circuits, and assigning defect weight values to each of the defects based on the defect information. Preferably, the defect weight values are in N number of defect weight value ranges, including a lowest defect weight value range and highest defect weight value range. For each integrated circuit, a heaviest defect is determined, where the heaviest defect is the defect on each integrated circuit having a highest defect weight value. For each of the N number of defect weight value ranges, a total number $T(n)$ of the heaviest defects having a defect weight value within each defect weight value range n is determined, where n equals one to N. The method includes determining a weighted total defect count $T_W(n)$, for n equals one to N, by weighting the total number $T(n)$ for each of the defect weight value ranges according to a weighting function $FP(n)$ which approaches zero at the lowest defect weight value range and approaches one at the highest defect weight value range. The method also includes determining an effective fatal defect count by summing the values of $T_W(n)$ for the N number of defect weight value ranges.

In various preferred embodiments of the method, the defect weight values are assigned to each of the defects based on defect size, where defects having a smallest size are in the lowest defect weight value range, and defects having a largest size are in the highest defect weight value range. Most preferably the integrated circuits are dice on a silicon wafer. The defect information is preferably collected during in line tests and at final test, such as at wafer sort. Most preferably, the steps other than acquiring the defect information are accomplished at a later point in time on a computerized analyzer.

The "heaviest only" weighting provided by the invention gives more weight to large defects than to small defects. Thus, the effective fatal defect count is weighted more heavily toward larger defects. Gauging yield based on an effective fatal defect count determined by heaviest only filtering, rather than based solely on the total number of defects, provides a better prediction of yield. In this manner, the present invention provides a more accurate indicator of future yield than has been previously available.

In some preferred embodiments, the method according to the invention includes determining a total number $T_D$ of the inspected integrated circuits, and determining a total number $T_G$ of inspected integrated circuits which pass electrical testing. The method also includes acquiring defect information related to defects in the inspected integrated circuits, and assigning defect weight values to each of the defects based on the defect information, where the defect weight values are within N number of defect weight value ranges. For each integrated circuit, a heaviest defect is determined, where the heaviest defect is the defect on each integrated circuit having a highest defect weight value. For each of the N number of defect weight value ranges, a total number $T(n)$ of the heaviest defects having a defect weight value within a defect weight value range n is determined, where n equals one to N. A total number $T_G(n)$ of the inspected integrated circuits which pass electrical testing though having a heaviest defect with a defect weight value falling within the defect weight value range n is also determined, where n equals one to N. A fail potential value $FP(n)$ is calculated based on $T_D$, $T(n)$, $T_G$, and $T_G(n)$, and an effective fatal defect count EFDC is calculated according to:

$$EFDC = \sum_{n=1}^{N}(T(n) \times FP(n)).$$

In some preferred embodiments, the weighting function $FP(n)$ is determined according to:

$$FP(n) = 1 - \frac{\left(\frac{T_G(n)}{T(n)}\right)}{\left(\frac{T_G - T_G(n)}{T_D - T(n)}\right)}$$

for each of the N number of defect weight value ranges.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
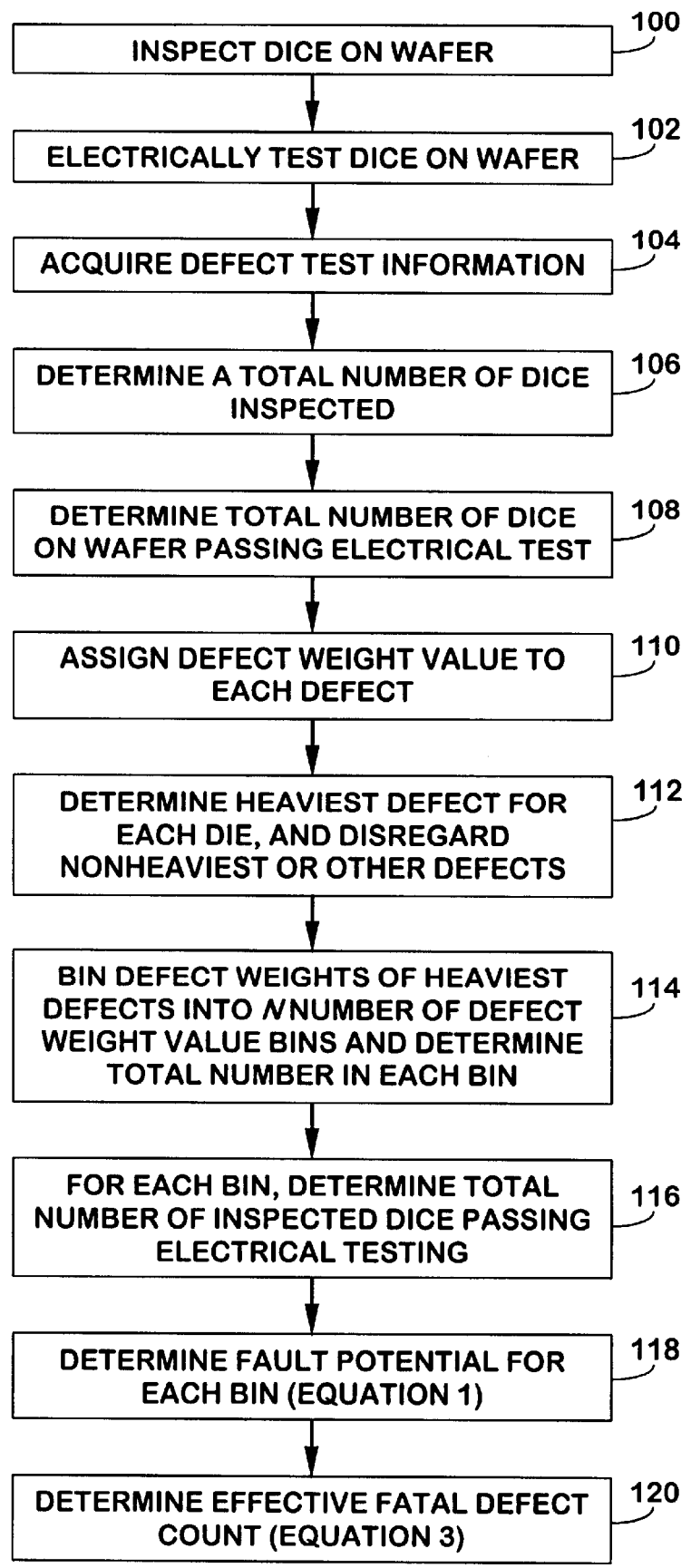
FIG. 1 is a flow chart of a preferred embodiment of a method according to the present invention.

Depicted in FIG. 1 is a flow chart of a preferred embodiment of a method for determining an effective fatal defect count, such as for gauging the quality of a substrate. FIG. 1 generally depicts the major steps of the method that may be used such as to determine whether a substrate is of sufficient quality to proceed to a subsequent fabrication process step in a processing sequence. Depicted in FIG. 2 is a functional block diagram of a preferred embodiment of an apparatus 10 for implementing the method of FIG. 1.

Referring to FIG. 1, in an initial inspection step 100, each individual integrated circuit, such as on the substrate, is visually inspected to find defects. Alternatively, a sample number of the integrated circuits are inspected for defects. These defects include, but are not limited to, scratches in the surface of the integrated circuit and undesired particles embedded in one or more layers of the integrated circuit, such as may cause the integrated circuit to fail one or more electrical tests. As depicted in FIG. 2, the inspection step 100 is preferably accomplished with an automated optical inspection system 12 of some sort, such as a model 2132 system manufactured by KLA-Tencor. For example, the inspection system 12 may be used to sense defect information such as the number, size, and location of particles on a substrate. The defect information collected by the inspection system 12 may also include a histogram of particles on the substrate according to particle size, the total number of particles on the substrate that exceed a given size, and an indication of the geographical distribution of the particles across the surface of the substrate. Of course, this is by way of example only, and many other types of defect information are included within the scope and spirit of the present invention. The inspections are preferably conducted during in line inspections and at final tests, such as wafer sort.

The integrated circuits inspected in step 100 are electrically tested (step 102) to determine whether the integrated circuits meet electrical specifications necessary for proper performance. In the preferred embodiment of the apparatus 10 of FIG. 2, electrical testing is accomplished using a substrate test system 14. The electrical tests of step 102 include, but are not limited to, the measurement of conductivity (or resistance) between two or more contacts on the integrated circuit. Based on the electrical tests of step 102, test information is generated which is indicative of whether the tested integrated circuits meet the electrical specifications. This test information may be in the form of a pass/fail flag, or may be in the form of detailed values, such as electrical resistance between various contacts on a integrated circuit. Again, this is by way of example only, and many other types of test information are included within the scope and spirit of the present invention. The electrical tests are preferably conducted during in line inspections and final tests, such as wafer sort.

Figure 2:
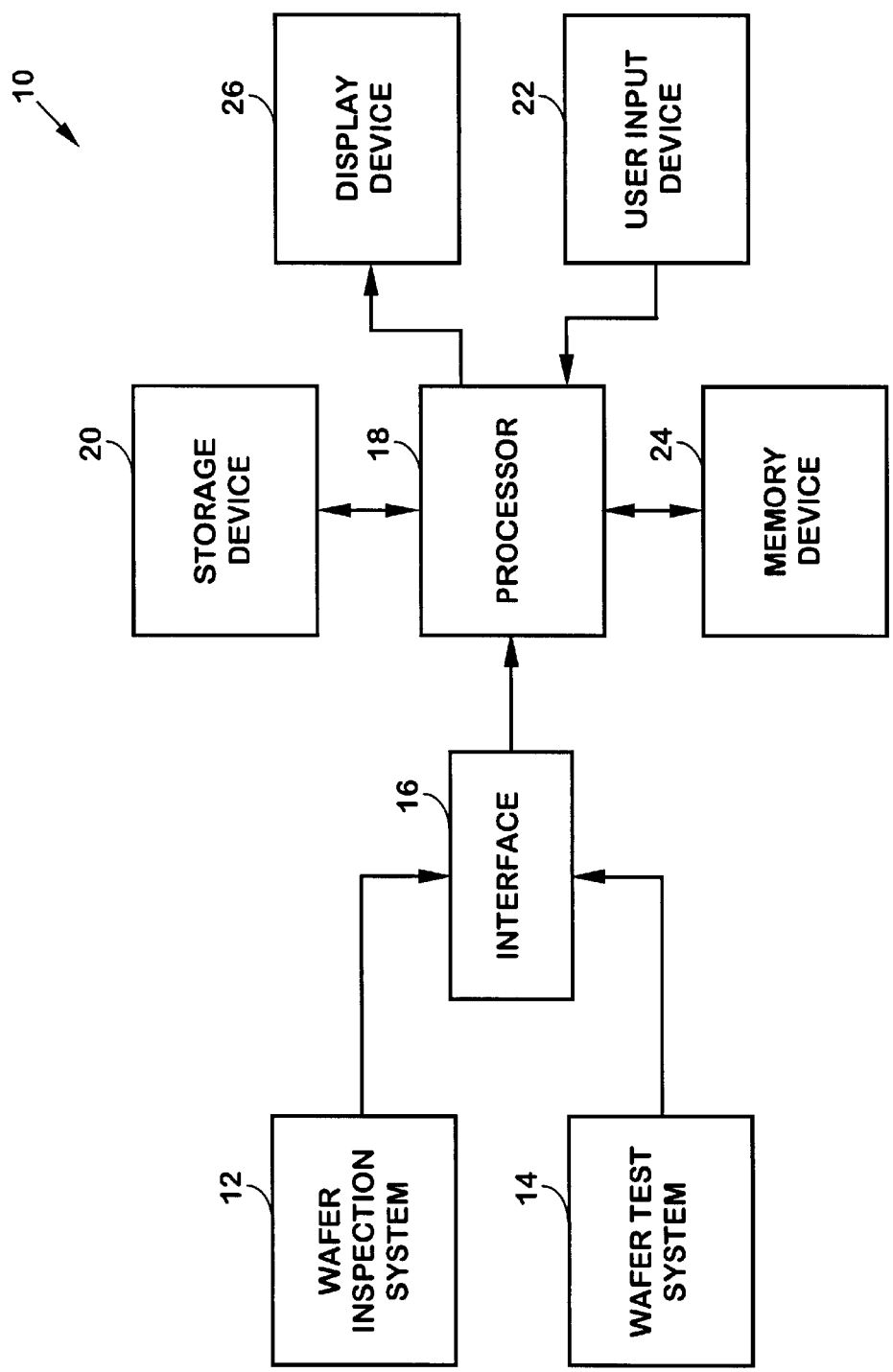
FIG. 2 is a functional block diagram of a preferred embodiment of an apparatus according to the present invention.

As shown in FIG. 2, the defect information from the substrate inspection system 12 and the test information from the substrate electrical test system 14 are preferably provided to an interface unit 16 which conditions the signals to be processed by a processor 18. The processor 18, such as a Pentium IV or similar device, acquires the test information and the defect information (step 104) and, as described in more detail below, determines a substrate quality value based thereon. The test and defect information may be acquired directly from the substrate inspection system 12 and the substrate test system 14 via the interface 16, or from a storage device 20 in which the test or inspection information has been previously stored. Preferably, the storage device 20 is a disc drive or other bulk storage device.

In the preferred embodiment of the invention, the process for determining a value for gauging substrate quality is performed by one or more software modules executed by the processor 18. Alternatively, some of the process steps may be carried out in the substrate inspection system 12, the substrate test system 14, or a combination of the two. Thus, in the following description, when a step is described as being carried out by the processor 18, one skilled in the art will appreciate that other of the system components may also be used to perform the step.

With reference to FIG. 1, the processor 18 determines a total number $T_D$ of integrated circuits, such as on the substrate, which have been inspected (step 106). This value may be acquired from the substrate inspection system 12, the substrate test system 14, or from a user input device 22, such as a keyboard. The processor 18 also determines a total number $T_G$ of integrated circuits, again such as on the substrate, which have passed electrical testing (step 108). Preferably, this value is acquired from the substrate test system 14, but may also be received from the user input device 22, or other source.

Based on the defect information provided by the substrate inspection system 12, a defect weight value $W_D$ is assigned to each defect on each inspected substrate (step 110). The criteria for defining defect weight may be defect size, such as measured in microns, or some electrical performance parameter, such as conductivity. In a preferred embodiment of the invention, the criteria for defining defect weight is defect size, and the process according to the invention is described in terms of defect size. However, the use of defect size is exemplary only, and other defect weight criteria are included within the scope and spirit of the present invention. If defect size is used as the defect weight criteria, the defect weight value $W_D$ for each defect is preferably the size of the defect, such as in microns.

Defects are described herein as being either light or heavy defects. A heavy defect is one having more weight based on the defining criteria. The heaviest defect on each integrated circuit is the one defect on the integrated circuit having the highest weight based on the defining criteria. For example, if the defect weight criteria is defect size, then the heaviest defect may be the largest defect. If the defect weight criteria is conductivity, then the heaviest defect may be the most conductive, as in the case of a bridging particle.

Figure 3:
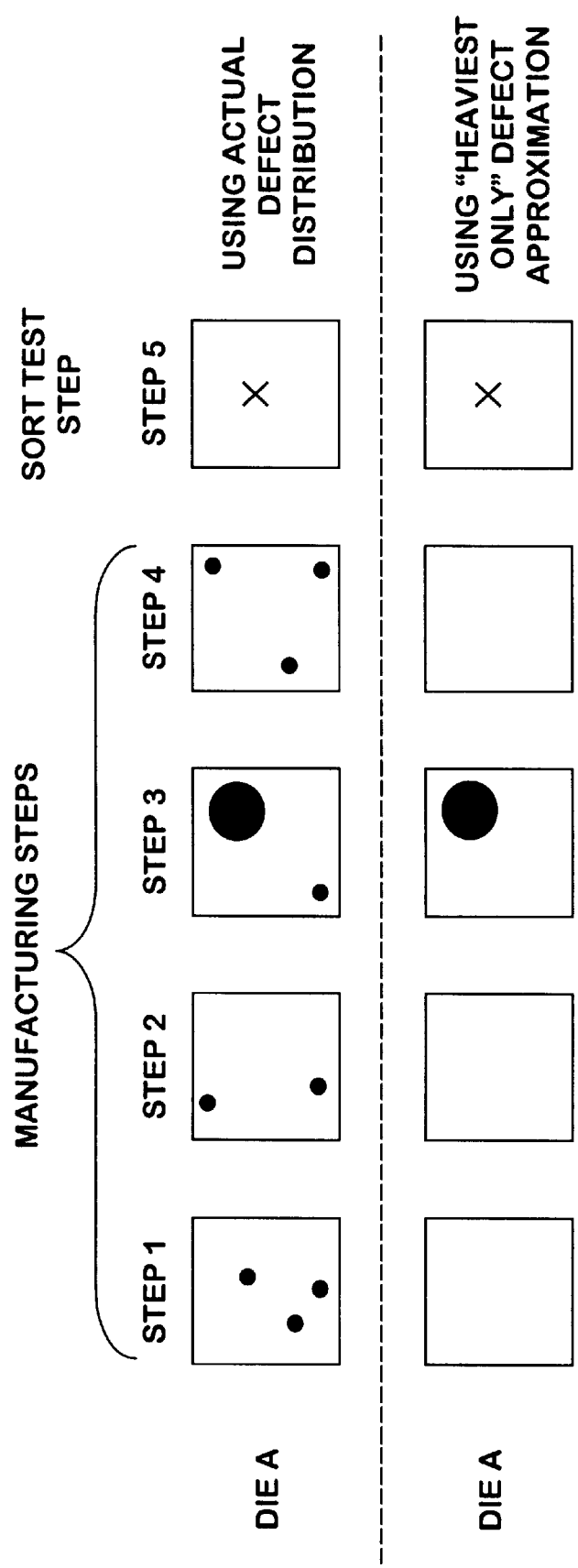
FIG. 3 depicts the application of heaviest only weighting according to a preferred embodiment of the present invention.

Based on the assigned defect weight values, the processor 18 determines which is the heaviest defect on each inspected integrated circuit (step 112). For example, if the defect weight criteria is defect size, the processor 18 determines the heaviest defect to be the largest defect on the integrated circuit. The lighter (or smaller) defects detected on each integrated circuit are preferably ignored in subsequent calculations. FIG. 3 depicts an example of the implementation of "heaviest only" defect weighting, where only the heaviest defect, which is detected at manufacturing step 3, is used in determining the defect distribution.

Based on the heaviest defects determined for each integrated circuit, the processor 18 determines a total number T(n) of the heaviest defects having defect weight values $W_D(n)$ within each of N number of ranges of weight values, for n equals one to N. (step 114). This process is also referred to herein as binning the heaviest defect weight values. For example, if the defect criteria is defect size, the weight value ranges, or bins, may include ranges of $W_D<0$ microns, $0 \leq W_D < 1$ microns, $1 \leq W_D < 2$ microns, $2 \leq W_D < 3$ microns, etc. Accordingly, the sum of the number of heaviest defects T(n) in each of the N number of weight value ranges is equivalent to a total number TD of heaviest defects on the substrate. Thus, the total number of heaviest defects TD may be expressed as:

$$TD = \sum_{n=1}^{N} T(n). \quad (1)$$

Based on the test information, the processor 18 determines a total number $T_G(n)$ of the inspected integrated circuits within each of the N number of bins that have passed the electrical testing (step 116). The sum of the number of inspected integrated circuits within each bin $T_G(n)$ which have passed electrical testing is equivalent, in one embodiment, to the total number $T_G$ of integrated circuits on the substrate which have passed electrical testing, as determined at step 108. Thus, the total number $T_G$ may be expressed as:

$$T_G = \sum_{n=1}^{N} T_G(n). \quad (2)$$

According to the present invention, the processor 18 applies a fail potential function to the total number T(n) of heaviest defects for each of the N number of defect weight value ranges (step 118). Preferably, the fail potential function FP approaches one for values of defect weight WD at the highest end of the defect weight value range, and approaches zero for values of defect weight $W_D$ at the lowest end of the defect weight value range. Expressed mathematically, FP→1 for $W_D \to \infty$, and FP→0 for $W_D \to 0$.

In a most preferred embodiment of the invention, the fail potential function FP(n) is expressed as:

$$FP(n) = 1 - \frac{\left(\frac{T_G(n)}{T(n)}\right)}{\left(\frac{T_G - T_G(n)}{T_D - T(n)}\right)}, \quad (3)$$

where the values $T_G(n)$, T(n), $T_G$, and $T_D$ are described above.

Although the fail potential function FP(n) is implemented according to equation (3) in the preferred embodiment of the invention, it should be appreciated that other functions could be implemented, as long as such functions approach one for values of defect weight at the highest end of the defect weight value range, and approach zero for values of defect weight at the lowest end of the defect weight value range.

According to the present invention, the value used to gauge substrate quality is determined by using the fail potential function FP to weight the heaviest defect count values T(n) for each of the N number of defect weight ranges. The product of the heaviest defect count values T(n) and the fail potential function FP(n) is referred to as a weighted total defect count $T_W(n)$, and is preferably determined by the processor 18 according to:

$$T_W(n) = T(n) \times FP(n). \quad (4)$$

The sum of $T_W(n)$ for all values of n, which is referred to herein as the effective fatal defect count EFDC, is determined (step 120) according to:

$$EFDC = \sum_{n=1}^{N} T_W(n) = \sum_{n=1}^{N} T(n) \times FP(n). \quad (5)$$

In the preferred embodiment, the EFDC value may be displayed on a display device 26, such as a computer monitor, or stored in a memory device 24 or storage device 20 for later processing. Preferably, the EFDC value is used by an operator to gauge the quality of the particular substrate under inspection.

Figure 4A:
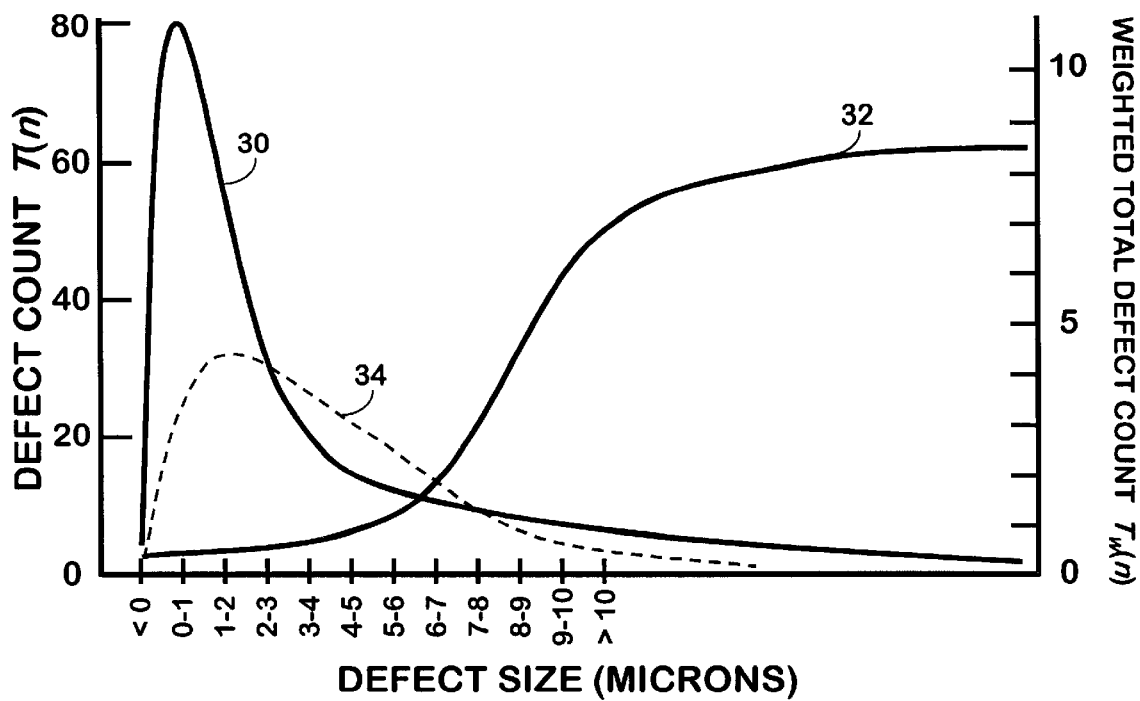
FIGS. 4A and 4B are graphical representations of total defect count, fail potential, and effective fatal defect count determined according to a preferred embodiment of the invention for two example scenarios.
Figure 4B:
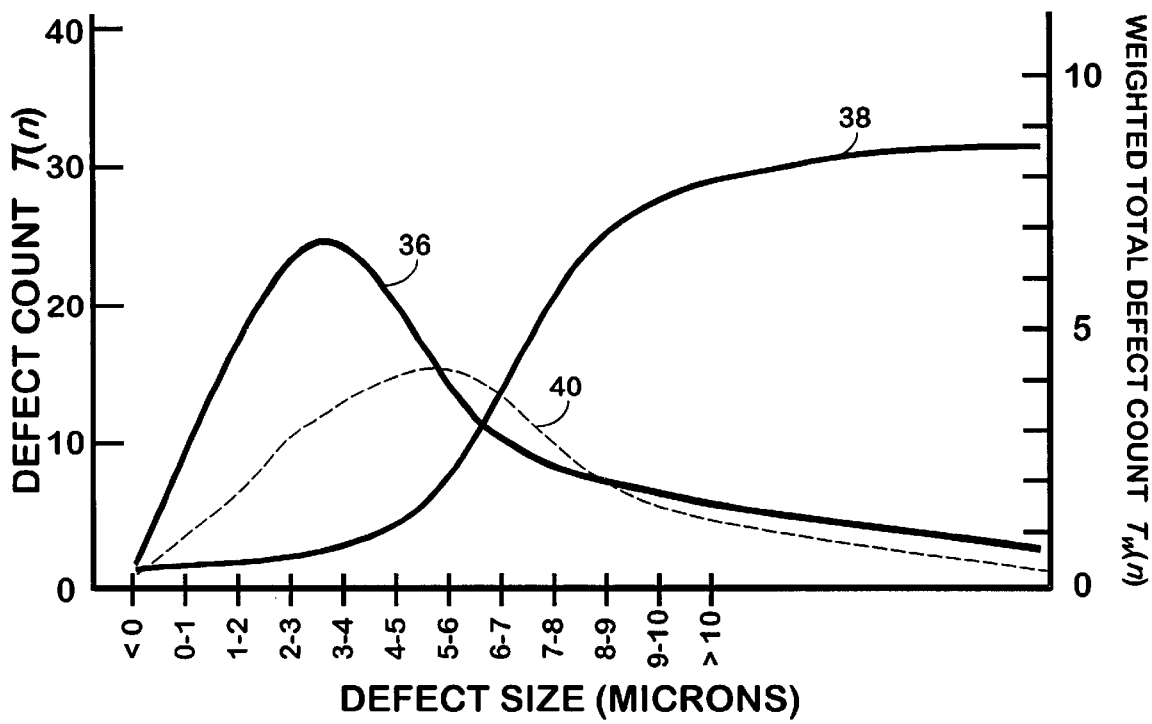

Examples of the calculation of the weighted total defect count $T_W(n)$ and the effective fatal defect count EFDC for two substrate defect scenarios are depicted in FIGS. 4A and 4B and Tables I and II. In each of the example cases, the substrate defects are binned to twelve defect weight value ranges (n =1 to 12), ranging from less than zero microns to greater than ten microns. The heaviest defect count T(n) for each bin is graphed as curve 30 in FIG. 4A and curve 36 in FIG. 4B. The fail potential function FP(n) is graphed as curve 32 in FIG. 4A and curve 38 in FIG. 4B. The weighted total defect count $T_W(n)$ is graphed as curve 34 in FIG. 4A and curve 40 in FIG. 4B.

TABLE I

| n | Defect Weight Value (microns) | Fail potential FP(n) | Total Heaviest Defect Count T(n) | Weighted Total Defect Count $T_w(n)$ |
|---|---|---|---|---|
| 1 | below 0 | 0.05 | 0 | 0 |
| 2 | 0 to 1 | 0.05 | 80 | 4 |
| 3 | 1 to 2 | 0.07 | 60 | 4.2 |
| 4 | 2 to 3 | 0.15 | 30 | 4.5 |
| 5 | 3 to 4 | 0.25 | 8 | 2 |
| 6 | 4 to 5 | 0.5 | 4 | 2 |
| 7 | 5 to 6 | 0.7 | 3 | 2.1 |
| 8 | 6 to 7 | 0.8 | 2 | 1.6 |
| 9 | 7 to 8 | 0.85 | 1 | 0.85 |
| 10 | 8 to 9 | 0.85 | 0 | 0 |
| 11 | 9 to 10 | 0.85 | 0 | 0 |
| 12 | 10 and above | 0.85 | 0 | 0 |
| | Totals | | $TD_1$ = 188 | $EFDC_1$ = 21.25 |

TABLE II

| n | Defect Weight Value (microns) | Fail potential FP(n) | Total Heaviest Defect Count T(n) | Weighted Total Defect Count $T_w(n)$ |
|---|---|---|---|---|
| 1 | below 0 | 0.05 | 0 | 0 |
| 2 | 0 to 1 | 0.05 | 16 | 0.8 |
| 3 | 1 to 2 | 0.07 | 25 | 1.75 |
| 4 | 2 to 3 | 0.15 | 20 | 3 |
| 5 | 3 to 4 | 0.25 | 12 | 3 |
| 6 | 4 to 5 | 0.5 | 8 | 4 |
| 7 | 5 to 6 | 0.7 | 6 | 4.2 |
| 8 | 6 to 7 | 0.8 | 5 | 4 |
| 9 | 7 to 8 | 0.85 | 4 | 3.4 |

TABLE II-continued

| n | Defect Weight Value (microns) | Fail potential FP(n) | Total Heaviest Defect Count T(n) | Weighted Total Defect Count $T_w(n)$ |
|---|---|---|---|---|
| 10 | 8 to 9 | 0.85 | 4 | 3.4 |
| 11 | 9 to 10 | 0.85 | 4 | 3.4 |
| 12 | 10 and above | 0.85 | 3 | 2.55 |
| | Totals | | $TD_2 = 107$ | $EFDC_2 = 33.5$ |

In the first case (Table I, FIG. 4A), a total of 188 heaviest defects are detected on the substrate ($TD_1=188$), most of which are in the second through fourth weight value bins (n=2–4). In that case, $EFDC_1$ is represented by the area under the curve 34, which is about 21.25. In the second case, (Table II, FIG. 4B), a total of 107 heaviest defects are detected on the substrate ($TD_2=107$), most of which are in the second through fifth weight value bins (n=2–5). In that case, $EFDC_2$ is represented by the area under the curve 40 which is about 33.5. Since the function FP(n) gives more weight to the larger defects, $EFDC_2$ is greater than $EFDC_1$, even though $TD_2$ is less than $TD_1$. Thus, although there are more total defects in the first case, those defects are generally smaller than those of the second case, and provide a smaller contribution to the calculation of EFDC.

In the past, a total of all defects, both large and small, has been used as a gauge for measuring substrate quality. However, it has been determined that gauging substrate quality, for example, based on EFDC determined by heaviest only filtering, rather than based solely on the total number of defects, provides a better estimation of substrate quality and, more generally, a better prediction of substrate yield. This is because the method according to the invention tends to filter out the noise of substrate quality estimations that are based solely on a total number defects, no matter how small those defects may be. Thus, the present invention provides a more accurate indicator than has been previously available.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for determining an effective fatal defect count based on defects in a plurality of inspected integrated circuits, the method comprising:
    (a) acquiring defect information related to defects in the inspected integrated circuits,
    (b) assigning defect weight values to each of the defects based on the defect information, where the defect weight values are in N number of defect weight value ranges, including a lowest defect weight value range and highest defect weight value range,
    (c) for each integrated circuit, determining a heaviest defect, which is the defect on each integrated circuit having a highest defect weight value,
    (d) determining a total number T(n) of the heaviest defects having a defect weight value within each defect weight value range n, for n equals one to N,
    (e) for n equals one to N, determining a weighted total defect count $T_W(n)$ by weighting the total number T(n) for each of the defect weight value ranges according to a weighting function which approaches zero at the lowest defect weight value range and approaches one at the highest defect weight value range, and
    (f) determining the effective fatal defect count by summing the values of $T_W(n)$ for the N number of defect weight value ranges.

2. The method of claim 1 wherein:
    step (e) further comprises determining the weighting function FP(n) for each of the N number of defect weight value ranges according to:

$$FP(n) = 1 - \frac{\left(\frac{T_G(n)}{T(n)}\right)}{\left(\frac{T_G - T_G(n)}{T_D - T(n)}\right)},$$

where
    $T_D$ is a total number of the inspected integrated circuits,
    T(n) is a total number of the heaviest defects having a defect weight value in the defect weight value range n,
    $T_G$ is a total number of inspected integrated circuits which pass electrical testing, and
    $T_G(n)$ is a total number of the inspected integrated circuits which pass electrical testing though having a heaviest defect with a defect weight value in the defect weight value range n, and step (f) further comprises determining the effective fatal defect count EFDC according to:

$$EFDC = \sum_{n=1}^{N} (T(n) \times FP(n)).$$

3. The method of claim 1 wherein step (b) further comprises assigning the defect weight values to each of the defects based on defect size, wherein defects having a smallest size are in the lowest defect weight value range, and defects having a largest size are in the highest defect weight value range.

4. The method of claim 1 wherein step (a) further comprises accessing a memory device containing defect data.

5. The method of claim 1 wherein the integrated circuits comprise dice on a silicon wafer.

6. The method of claim 1 wherein step (a) further comprises acquiring defect information from in line testing of the integrated circuits.

7. The method of claim 1 wherein step (a) further comprises acquiring defect information from final testing of the integrated circuits.

8. The method of claim 1 wherein step (a) is accomplished on at least one tester and steps (b)–(f) are accomplished at a later time than step (a) on a computerized analyzer.

9. A method for determining an effective fatal defect count based on defects in a plurality of inspected integrated circuits, the method comprising:
    (a) determining a total number $T_D$ of the inspected integrated circuits,
    (b) acquiring defect information related to defects in the inspected integrated circuits, (c) assigning defect weight values to each of the defects based on the defect information, where the defect weight values are within N number of defect weight value ranges, (d) for each integrated circuit, determining a heaviest defect, which is the defect on each integrated circuit having a highest defect weight value, (e) determining a total number T(n) of the heaviest defects having a defect weight value within each defect weight value range n, for n equals one to N, (f) determining a total number $T_G$ of inspected integrated circuits which pass electrical testing, (g) for n equals one to N, determining a total number $T_G(n)$ of the inspected integrated circuits which pass electrical testing though having a heaviest defect with a defect weight value falling within the defect weight value range n, (h) for n equals one to N, determining a fail potential value FP(n) based on $T_D$, T(n), $T_G$, and $T_G(n)$, and (i) determining the effective fatal defect count EFDC according to:

$$EFDC = \sum_{n=1}^{N} (T(n) \times FP(n)).$$

10. The method of claim 9 wherein step (c) further comprises assigning the defect weight values to each of the defects based on defect size, wherein defects having a smallest size are in the lowest defect weight value range, and defects having a largest size are in the highest defect weight value range.

11. The method of claim 9 wherein step (b) further comprises accessing a memory device containing defect data.

12. The method of claim 9 wherein the integrated circuits comprise dice on a silicon wafer.

13. The method of claim 9 wherein step (b) further comprises acquiring defect information from in line testing of the integrated circuits.

14. The method of claim 9 wherein step (b) further comprises acquiring defect information from final testing of the integrated circuits.

15. The method of claim 9 wherein step (b) is accomplished on at least one tester and steps (c)–(i) are accomplished at a later time than step (b) on a computerized analyzer.

16. A method for determining an effective fatal defect count based on defects in a plurality of inspected integrated circuits, the method comprising:

(a) acquiring defect information related to defects in the inspected integrated circuits, (b) assigning defect weight values to each of the defects based on the defect information, where the defect weight values are in N number of defect weight value ranges, (c) for each integrated circuit, determining a heaviest defect, which is the defect on each integrated circuit having a highest defect weight value, (d) for each of the N number of defect weight value ranges, determining a fail potential value FP(n) according to:

$$FP(n) = 1 - \frac{\left(\frac{T_G(n)}{T(n)}\right)}{\left(\frac{T_G - T_G(n)}{T_D - T(n)}\right)},$$

where $T_D$ is a total number of the inspected integrated circuits,

T(n) is a total number of the heaviest defects having a defect weight value in the defect weight value range n, $T_G$ is a total number of inspected integrated circuits which pass electrical testing, and $T_G(n)$ is a total number of the inspected integrated circuits which pass electrical testing though having a heaviest defect with a defect weight value in the defect weight value range n, and (e) determining the effective fatal defect count EFDC according to:

$$EFDC = \sum_{n=1}^{N} (T(n) \times FP(n)).$$

17. The method of claim 16 wherein step (b) further comprises assigning the defect weight values to each of the defects based on defect size, wherein defects having a smallest size are in the lowest defect weight value range, and defects having a largest size are in the highest defect weight value range.

18. The method of claim 16 wherein step (a) further comprises accessing a memory device containing defect data.

19. The method of claim 16 wherein the integrated circuits comprise dice on a silicon wafer.

20. The method of claim 16 wherein step (a) is accomplished on at least one of an in line tester and a final tester, and steps (b)–(e) are accomplished at a later time than step (a) on a computerized analyzer.

* * * * *